United States Patent [19]

Haskell

[11] Patent Number: 4,516,316
[45] Date of Patent: May 14, 1985

[54] METHOD OF MAKING IMPROVED TWIN WELLS FOR CMOS DEVICES BY CONTROLLING SPATIAL SEPARATION

[75] Inventor: Jacob D. Haskell, Palo Alto, Calif.

[73] Assignee: Advanced Micro Devices, Inc., Sunnyvale, Calif.

[21] Appl. No.: 593,763

[22] Filed: Mar. 27, 1984

[51] Int. Cl.$^3$ .................... H01L 21/265; H01L 21/22; H01L 17/00
[52] U.S. Cl. .................... 29/576 W; 29/571; 29/576.3; 148/1.5; 148/187; 148/DIG. 82; 156/643; 357/42; 357/91
[58] Field of Search ............... 29/576 B, 571, 576 W; 148/1.5, 187, DIG. 82; 156/643; 357/42, 91

[56] References Cited

U.S. PATENT DOCUMENTS

| | | | |
|---|---|---|---|
| 4,295,266 | 10/1981 | Hsu | 29/571 |
| 4,373,965 | 2/1983 | Smigelski | 148/1.5 |
| 4,435,895 | 3/1984 | Parrillo et al. | 29/571 |
| 4,441,246 | 4/1984 | Redwine | 29/571 |
| 4,472,459 | 9/1984 | Fisher | 29/576 W |

Primary Examiner—Upendra Roy
Attorney, Agent, or Firm—Patrick T. King; Eugene H. Valet

[57] ABSTRACT

An improved method for forming complementary wells in a substrate is disclosed. A polysilicon layer is applied to the substrate, and the polysilicon layer is doped. An oxidation barrier layer is applied over the doped polysilicon layer. A portion of the doped polysilicon and oxidation layers are removed to expose a well region of one conductivity type in the substrate, and the well is then implanted in the exposed region. The surface of the well, and the polysilicon layer proximate the well beneath the oxidation barrier layer, are then steam oxidized until the lateral desired oxide penetration into the polysilicon layer beneath the oxidation barrier layer has been reached. This forms an oxide masking layer covering and extending beyond the formed well. The remaining oxide barrier layer is then removed to expose a well region of the other conductivity type. This second well region is spaced from the well region already formed by the extended oxide masking layer. The second well is then implanted. With the complementary wells implanted, the oxide masking layer is removed, and the wells are driven to the desired depth.

19 Claims, 7 Drawing Figures

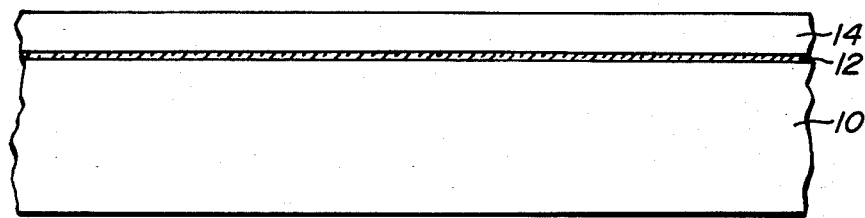
FIG._1.
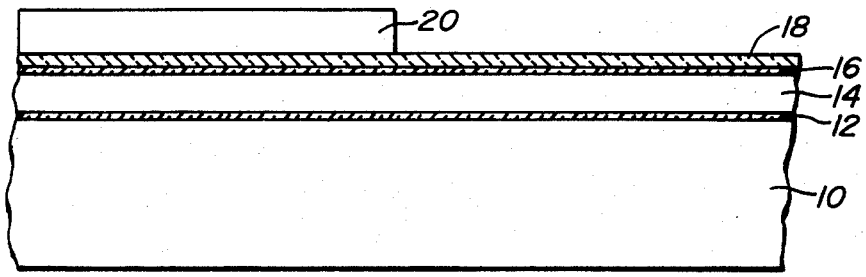
FIG._2.
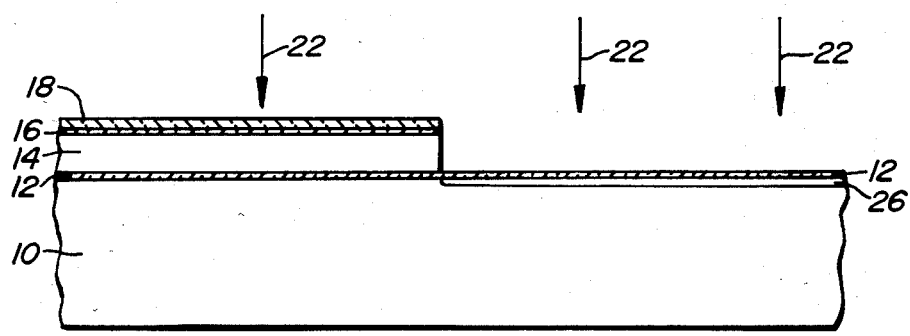
FIG._3.
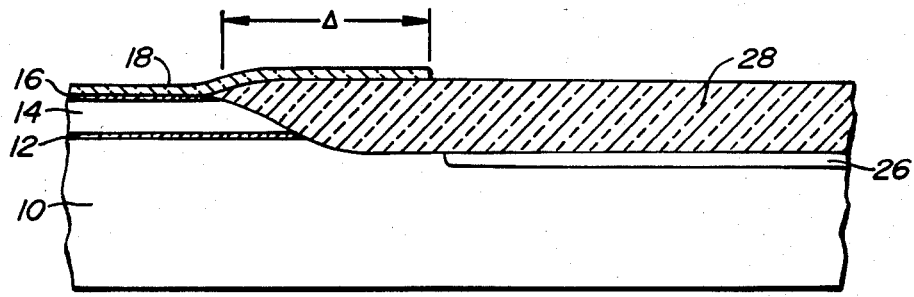
FIG._4.

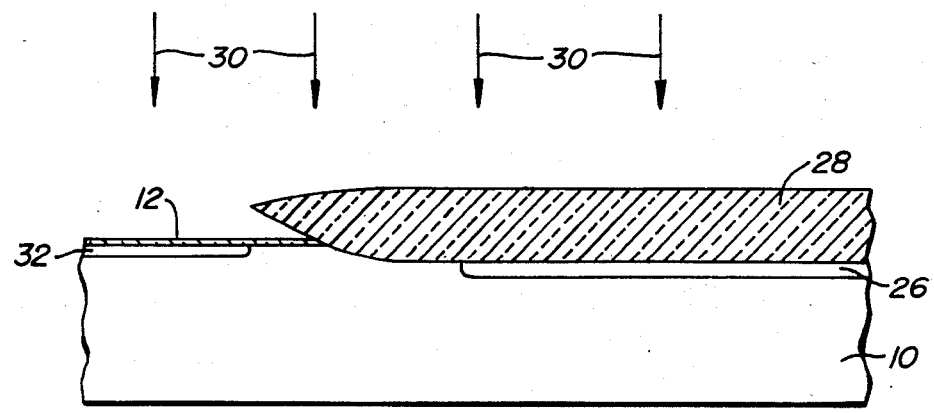
FIG._5.
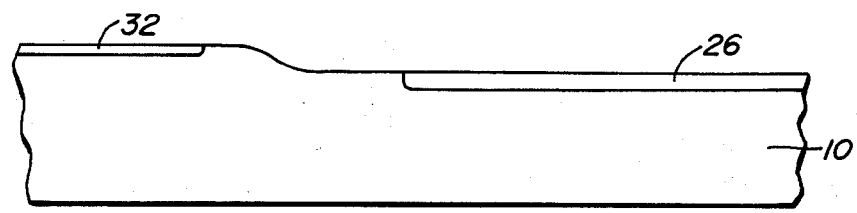
FIG._6.
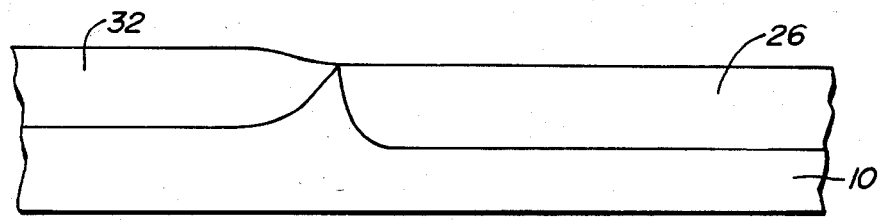
FIG._7.

METHOD OF MAKING IMPROVED TWIN WELLS FOR CMOS DEVICES BY CONTROLLING SPATIAL SEPARATION

BACKGROUND OF THE INVENTION

The present invention relates to an improved semiconductor construction of the twin well (often called "twin tub") type.

The twin well type of semiconductor construction is discussed in "Twin-Tub CMOS - A Technology for VLSI Circuits", Parrillo et al., Paper 29.1, IEEE Conference, 1980. In this type of semiconductor construction, the initial step is the formation of p and n type wells in the underlying substrate, typically a high-resistance semiconductor. One well is formed by conventional masking, and the first well area is oxidized to provide the mask for forming the complementary well, resulting in the wells being self-aligned. Complementary n+ and p+ areas are thereafter formed in the wells, as discussed in the referenced paper.

While the twin well technique of semiconductor construction has many advantages, it has been found that there is significant compensation between the wells at their borders as the chip operates. When the wells are oxidized the p impurity at the substrate surface (typically boron) is depleted and the n impurity (phosphorous or arsenic) builds up. Because of this compensation, the border location between the wells at the substrate migrates into the original n well region. To allow for such border migration, there must be significant spacing between the adjacent n+ and p+ areas formed in the wells, limiting the number of usable areas which can be formed in a substrate of given dimensions.

SUMMARY OF THE INVENTION

The present invention provides an improved method for forming complementary wells in a substrate by controlling their separation. A polysilicon layer is applied to the substrate, and the polysilicon layer is doped. An oxidation barrier layer is applied over the doped polysilicon layer. A portion of the doped polysilicon and oxidation layers are removed to expose a well region of one conductivity type in the substrate, and the well is then implanted in the exposed region. The surface of the well, and the polysilicon layer proximate the well beneath the oxidation barrier layer, are then steam oxidized until the desired lateral oxide penetration into the polysilicon layer beneath the oxidation barrier layer has been reached. This forms an oxide masking layer covering and extending beyond the formed well. The remaining oxide barrier layer is then removed to expose a well region of the other conductivity type. This second well region is spaced from the well region already formed by the extended oxide masking layer. The second well is then implanted. With the complementary wells implanted, the oxide masking layer is removed, and the wells are driven to the desired depth.

As the wells are driven to their desired depth, they remain spaced from one another beneath the surface of the substrate, touching only at the surface as required for proper operation. Because of the intervening substrate between the well regions except at the surface, compensation and resulting migration of the borders of the wells is minimized. As a result, the n+ and p+ areas in the wells after local oxidation has taken place can be placed much closer together, up to 4 microns closer (for wells approximately 4 microns deep) if all else is equal, yielding a significantly greater packing density for the system as a whole.

The novel features which are characteristic of the invention, as to organization and method of operation, together with further objects and advantages thereof will be better understood from the following description considered in connection with the accompanying drawings in which a preferred embodiment of the invention is illustrated by way of example. It is to be expressly understood, however, that the drawings are for the purpose of illustration and description only and are not intended as a definition of the limits of the invention.

BRIEF DESCRIPTION OF THE DRAWINGS

FIG. 1 is a fragmentary section view of a substrate with the polysilicon layer applied;

FIG. 2 is a subsequent section view showing application of a nitride layer and a mask;

FIG. 3 is a subsequent section view showing implanting of the p well;

FIG. 4 is a subsequent section view showing growth of the oxide mask;

FIG. 5 is a subsequent section view showing implanting of the n well;

FIG. 6 is a subsequent section view showing removal of the oxide mask;

FIG. 7 is a subsequent section view showing the wells driven to completion.

DESCRIPTION OF THE PREFERRED EMBODIMENT

As illustrated in FIG. 1, the semiconductor construction of the present invention initiates with a silicon substrate 10. This is typically a high-resistivity substrate to obtain precise control over the semiconductor elements to be formed in the substrate. A thin layer 12 of a barrier oxide, typically having a thickness on the order of 600 Angstroms, is grown on top of substrate 10. A layer of polysilicon 14 having a thickness of approximately 5,000 Angstroms is deposited over barrier oxide layer 12. Polysilicon layer 14 is then doped with phosphorous oxychloride, or other conventional n-type dopants known in the art.

Turning to FIG. 2, a second oxide layer 16, having a thickness of about 500 Angstroms, is grown over doped polysilicon layer 14. A nitride layer 18, having a thickness of approximately 700 Angstroms, is then deposited over barrier oxide layer 16 using low pressure chemical vapor deposition. A mask 20 is then applied over nitride layer 18, which has gaps where a p well is to be implanted.

With mask 20 in place, the structure is etched using known plasma, wet and plasma techniques, or all plasma techniques, in sequence. The etching steps remove those portions of nitride layer 18, oxide layer 16, and polysilicon layer 14 not protected by mask 20. After the etching step has been completed, mask 20 is removed, leaving the configuration of FIG. 3.

As illustrated by arrows 22 in FIG. 3, boron is implanted through the barrier oxide 12 where exposed using conventional techniques. Where barrier oxide layer 12 is covered by polysilicon layer 14 and nitride layer 18, the configuration of substrate 10 is unaltered. The implanted boron forms the initial p well 26.

The structure is next steam oxidized at approximate 800° C. Doped polysilicon oxidizes rapidly in steam so that junctions which have been formed in the substrate are not driven in. The portions of the doped polysilicon layer 14 proximate the removed portions of the oxide layer 16 are oxidized. The substrate 10 under the exposed barrier oxide layer 18 is also oxidized. Thus, the steam oxidation forms an oxide masking layer 28, which covers the initial p well 26, and extends laterally into polysilicon layer 14 beneath nitride layer 18 (FIG. 4). To permit this rapid oxidation of the doped polysilicon layer 14, the layer 14 should be greater than 4000 Angstroms thick. This permits an adequate amount of steam to reach the layer 14 from its exposed sides after the etching step shown in FIG. 3. The length of the steam oxidation step is controlled to obtain the appropriate "Δ" beneath nitride layer 18. As will be illustrated hereinafter, the Δ determines the spacing between complementary wells.

The remainder of nitride layer 18 and polysilicon layer 14 are then stripped, using a conventional wet process, to obtain the configuration illustrated in FIG. 5. Phosphorous or arsenic is then implanted, as illustrated by arrows 30, using conventional techniques, to form an initial n well 32. As the n well is implanted, oxide masking layer 28 prevents contamination of p well 26, and a gap is thus provided between the well 26 and n well 32.

Oxide masking layer 28 and oxide barrier layer 12 are then stripped to the bare silicon of substrate 10, as illustrated in FIG. 6. Wells 26, 32 are then heated, using conventional techniques, to complete the implantation of the wells by diffusing the well dopants for the drive-in step, as illustrated in FIG. 7. In the final configuration, wells 26, 32 barely touch each other or are slightly removed from each other at the surface of substrate 10, and beneath the surface a substantial separation exists to minimize compensation, and resulting migration, between the wells.

The implanted dopants diffuse laterally at a rate of 0.7 times the vertical diffusion rate. For example, two wells having impurities of the same diffusion rate diffuse toward each other to meet at a halfway point. If the wells are to have a depth of 4 microns, then Δ should be 5.6 microns. Therefor the separation Δ between wells is related to the depth of the wells and the particular dopant, which often diffuse at different rates through a substrate. Process variations include partially diffusing one well before the second is implanted. The well depths may be different. In any case, Δ is selected according to the particular process so that after the drive-in step, the two wells barely contact each other or are slightly removed at the substrate surface.

While a preferred embodiment of the present invention has been illustrated in detail, it is apparent that modifications and adaptations of that embodiment may occur to those skilled in the art. For example, while in the preferred embodiment the p well is formed before the n well, the wells could be formed in reverse order. However, it is to be expressly understood that such modifications and adaptations are within the spirit and scope of the present invention, as set forth in the following claims.

What is claimed is:

1. A method for forming complementary wells of first and second conductivity types in a substrate comprising the steps of:
    applying a polysilicon layer to the substrate;
    doping the polysilicon layer;
    applying an oxidation barrier layer over the doped polysilicon layer;
    removing a portion of the doped polysilicon and the oxidation barrier layers to expose a well region of the first conductivity type in the substrate;
    implanting a well of the first conductivity type in the exposed well region;
    steam oxidizing the surface of the well of the first conductivity type and the polysilicon layer proximate the well of the first conductivity type beneath the oxidation barrier layer until the desired lateral oxide penetration into the polysilicon layer beneath the oxidation barrier layer has been reached to form an oxide masking layer covering and extending beyond the borders of the well of the first conductivity type;
    removing the remaining oxide barrier layer to expose a well region of the second conductivity type spaced from the well region of the first conductivity type by the extended oxide masking layer;
    implanting a well of the second conductivity type in the exposed well region;
    removing the oxide masking layer; and
    driving the wells to the desired depth, the wells remaining spaced from one another beneath the surface of the substrate to minimize compensation and migration of the well borders.

2. The method of claim 1 wherein the first conductivity type is p-conductivity type, and the second conductivity type is n-conductivity type.

3. A method for forming complementary wells in a substrate comprising the steps of:
    applying a polysilicon layer to the substrate;
    doping the polysilicon layer;
    applying an oxidation barrier layer over the doped polysilicon layer;
    removing a portion of the doped polysilicon and the oxidation barrier layer to expose a p well region in the substrate;
    implanting a p well in the exposed p well region;
    steam oxidizing the surface of the p well and the polysilicon layer proximate the p well beneath the oxidation barrier layer until the desired lateral oxide penetration into the polysilicon layer beneath the oxidation barrier layer has been reached to form an oxide masking layer covering the p well and extending beyond the borders of the p well;
    removing the remaining oxide barrier layer to expose an n well region spaced from the p well by the extended oxide masking layer;
    implanting an n well in the exposed n well region;
    removing the oxide masking layer; and
    driving the wells to the desired depth, the wells remaining spaced from one other beneath the surface of the substrate to minimize compensation and migration of the well borders.

4. The method of claim 1 or 3 and additionally comprising the steps of growing an oxide barrier layer having a thickness of approximately 600 Angstroms on the substrate before applying the polysilicon layer, and growing a second oxide layer having a thickness of about 500 Angstroms over the doped polysilicon layer.

5. The method of claim 1 or 3 wherein said doping step comprises doping the polysilicon layer with phosphorous oxychloride.

6. The method of claim 1 or 3 wherein said oxidation barrier layer applying step comprises applying a nitride layer by low pressure chemical vapor deposition.

7. The method of claim 1 or 3 wherein said doped polysilicon and oxidation barrier layer removing step comprises masking other than the p well region of the substrate and etching the unmasked area.

8. The method of claim 2 or 3 wherein said p well implanting step comprises implanting boron in the exposed p well region.

9. The method of claim 1 or 3 wherein said steam oxidizing step includes steam oxidizing at about 800° C.

10. The method of claim 2 or 3 wherein the n well implanting step comprises implanting phosphorous in the exposed n well region.

11. The method of claim 2 or 3 wherein the n well implanting step comprises implanting arsenic in the exposed n well region.

12. The method of claim 1 or 3 wherein said oxide masking layer removing step comprises stripping the oxide to the bare silicon of the substrate.

13. The method of claim 2 or 3 and additionally comprising the step of growing an oxide layer of approximately 400 Angstroms over the p well and n well subsequent to the oxide masking layer removing step and prior to the well driving step.

14. The method of claim 1 or 3 wherein the driven wells meet at the surface of the substrate.

15. The method of claim 14 wherein the driven wells meet only at the surface of the substrate and are spaced from one another beneath said surface.

16. A method for forming complementary wells in a semiconductor substrate comprising:

forming a layer of oxidizeable material on said substrate, forming a layer of oxidation masking material on said oxidizeable layer, removing portions of said oxidation masking layer and said oxidizeable layer to define a first region in said substrate, introducing impurities of a first polarity into said first region through said removed portions to form a well region of said first polarity, oxidizing said substrate and said oxidizeable layer so that an oxide layer is formed over said first region and portions of said oxidizeable layer proximate said removed portions are oxidized, removing said oxidation masking layer and unoxidized portions of said oxidizeable layer to define a second region in said substrate, introducing impurities of a polarity complementary to said first polarity into said second region through said removed portions of said unoxidized portions to form a well region of said complementary polarity.

17. The method as in claim 16 wherein said oxidizeable material comprises polysilicon.

18. The method as in claim 17 wherein in said oxidizing steps, said portions of said oxidizeable layer proximate said removed portions are oxidized laterally by a predetermined amount dependent upon the particular semiconductor process selected.

19. The method as in claim 18 further comprising:

heating said substrate to drive in said impurities of said first and complementary well regions so that said first and complementary well regions contact each other at the surface of said substrate.

* * * * *